(12) United States Patent
Briere

(10) Patent No.: US 7,863,877 B2
(45) Date of Patent: Jan. 4, 2011

(54) MONOLITHICALLY INTEGRATED III-NITRIDE POWER CONVERTER

(75) Inventor: Michael A. Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 278 days.

(21) Appl. No.: 11/999,552

(22) Filed: Dec. 4, 2007

(65) Prior Publication Data

US 2008/0136390 A1 Jun. 12, 2008

Related U.S. Application Data

(60) Provisional application No. 60/874,411, filed on Dec. 11, 2006.

(51) Int. Cl.
*G05F 1/56* (2006.01)
*G05F 1/42* (2006.01)

(52) U.S. Cl. .................. 323/282; 323/284; 323/285; 323/222; 323/224

(58) Field of Classification Search ............... 323/282, 323/284, 285, 222, 224
See application file for complete search history.

(56) References Cited

U.S. PATENT DOCUMENTS

| 5,440,520 | A | 8/1995 | Schutz | |
|---|---|---|---|---|
| 6,483,204 | B2 | 11/2002 | Hanaki | |
| 7,382,001 | B2 * | 6/2008 | Beach | 257/194 |
| 7,465,997 | B2 * | 12/2008 | Kinzer et al. | 257/401 |
| 2006/0198173 | A1 * | 9/2006 | Rozman | 363/123 |
| 2006/0279351 | A1 * | 12/2006 | Salato et al. | 327/524 |

FOREIGN PATENT DOCUMENTS

KR 2002-0007131 1/2002

* cited by examiner

*Primary Examiner*—Bao Q Vu
(74) *Attorney, Agent, or Firm*—Farjami & Farjami LLP

(57) ABSTRACT

A power arrangement that includes a monolithically integrated III-nitride power stage having III-nitride power switches and III-nitride driver switches.

29 Claims, 5 Drawing Sheets

MONOLITHICALLY INTEGRATED III-NITRIDE POWER CONVERTER

RELATED APPLICATION

This application is based on and claims priority to the of U.S. Provisional Application Ser. No. 60/874,411, filed on Dec. 11, 2006, entitled MONOLITHICALLY INTEGRATED GaN POWER CONVERTER, to which a claim of priority is hereby made and the disclosure of which is incorporated by reference.

DEFINITION

III-nitride device, including III-nitride power device, as called for herein refers to a semiconductor device that includes a III-nitride heterojunction having a conductive channel commonly referred to as a two-dimensional electron gas. The if III-nitride heterojunction would include two semiconductor bodies each being formed of a semiconductor alloy from the InAlGaN system.

FIELD OF THE INVENTION

This invention relates to semiconductor drivers and processes for their manufacture and more specifically relates to a novel integrated circuit employing plural III-nitride power devices and drivers therefor.

BACKGROUND OF THE INVENTION

Integrated circuits (ICs) are well known in which plural silicon devices are formed in a common chip or die. It is difficult to integrate certain kinds of circuits, for example, a buck converter circuit, which employs a power level synchronous MOSFET, a power level control MOSFET and the drivers therefor, especially in silicon because of device sizes and interconnections and the need for integrating high voltage and low voltage devices and their drivers in a single silicon die. Because of layout limitations, the connections between power devices and their predrivers would be relatively long and non-linear, introducing undesired parasitics.

It would however be very desirable to provide an integrated circuit containing the power semiconductors, their drivers and, in some cases, passive circuit components as well, particularly for ac to dc or dc to dc converters, which will occupy a small area on a board and have low cost. It would also be desirable to improve the performance of such devices by reducing the parasitic impedances particularly parasitic inductance caused by device layout and interconnections.

BRIEF DESCRIPTION OF THE INVENTION

According to one aspect of the present invention, the power stage is formed in a III-nitride-based semiconductor body, and integrated (for example, directly attached to the load or mounted as close as possible to the load) preferably with the load such that the distance between the load and the power stage is minimized. For example, the power stage may include III-nitride based power switches and III-nitride based predrivers for driving the power switches which are together mounted directly on the load or disposed as close as possible to the load.

The closeness of the III-nitride-based power stage and the load reduces parasitic inductances due to long leads and wires (present in the prior art) and thus improves the overall performance of the circuit. In one variation, the III-nitride based power stage may use bumps (such as copper bumps) to be flip chip mounted to reduce or eliminate wirebonds, and thus further reduce parasitic resistance and inductance. For example, the power stage may be flip chip mounted on pads provided on the load or pads on a circuit board which is mounted on the load.

According to another aspect of the present invention, the load may be modified to include the proper circuitry to operate the power stage. Thus, the load may operate the power stage eliminating the need for PWM drivers or the like circuits. That is, for example, a load such as a processor may include a PWM driver for controlling the power stage directly, instead of sending load requirements to a PWM stage.

In another variation, while the power stage may be physically integrated with the load, the power stage may be driven from an external PWM driver or the like driver.

An implementation according to the present invention is advantageous for the following reasons. While vertical conduction PN junction type devices (e.g. silicon devices) can satisfy the power requirements of a load efficiently, vertical conduction devices are difficult to integrate with a load such as a processor. Lateral PN junction type power devices can integrate well but cannot satisfy the power requirements of some loads such as processors efficiently (that is the current density of lateral devices are limited). Moreover, conventional devices generate a relatively large amount of heat during operation which would add to the thermal load of the load, an undesirable result.

A III-nitride based power device can run at higher temperatures, is lateral and thus can integrate well with a processor, and can readily satisfy the power requirements of a processor. Moreover, III-nitride based devices occupy less area per power capability, and, therefore, it is possible to have a III-nitride based device mounted directly on or very close to a load such as a processor (e.g. on the same substrate as that used for the processor) with relative ease. Moreover, III-nitride based power devices can be operated at very high frequencies. As a result, the passives used in the power stage (e.g. inductor and capacitors in the output stage) can be reduced in size, which allows for the integration of the passives along with the power stage and the load. Moreover, III-nitride based devices have low charge. For all these reasons, the integration of a III-nitride based power stage with a conventional processor provides significant advantages not found in the prior art.

In accordance with an aspect of the present invention, a lateral IC is formed in a substrate to define a power stage that includes plural III-nitride power switching devices and their predrivers and, if desired, passive circuit components such as gate driver capacitors, on a single III-nitride heterojunction type structure with parallel spaced and elongated source, gate and drain lines which are interconnected on the device surface by short, straight conductors where needed. The use of a lateral III-nitride device permits the efficient layout of the power III-nitride switches and of their driver switches which are separated by a simple insulation well or the like.

The end structure is monolithically integrated to form any desired circuit, such as d-c to d-c converters for use with mobile or other electronic applications, particularly, a buck converter for receiving an input battery voltage and producing a highly regulated, reduced output voltage as a power supply to other circuits.

In one embodiment of the invention, a buck converter is formed, having a control switch and a synchronous switch which are interconnected such that the node between them is connected to an output inductor and capacitor as usual, while their drivers or predrivers, which provide the gate control signals for the control switch and synchronous switch are formed on extensions, in single respective chips, of the same source, gate and drain regions used for the power device. The level shift circuit for the predrivers may also be integrated into the monolithic chip. This then permits a simplified layout for the device, which drastically reduces parasitics between the predrivers and power switches.

A device according to the present invention has reduced cost and uses small areas of a circuit board. The integration of the control switch and synchronous switch and their drivers lead to reduced mounting and handling costs as compared to the costs of mounting and handling the very small parts when formed as discretes.

Further, the performance of the device is improved, using suitable connections between the control switch and synchronous switch and their drivers, virtually eliminating parasitic inductance.

As to advantages of the predrivers, the cost is very small and performance is improved, with the devices being fast, low Q and low R for low loss. Further, there is a great reduction in parasitic impedances between the predrivers and the respective power switches.

Substantial benefits are also obtained during fabrication of the predrivers with the power switches in that the predriver characteristics will be well matched, being subjected to the same oven temperatures, and deadtime is well optimized. Further, the trimming of the devices takes place at the same oven temperature.

The integrated chip may be conventionally packaged and mountable to a heat sink or the like. The microprocessor chip for driving the drivers may be in the same package or closely spaced therefrom.

Other features and advantages of the present invention will become apparent from the following description of the invention which refers to the accompanying drawings.

DETAILED DESCRIPTION OF EMBODIMENTS OF THE INVENTION

Figure 1:
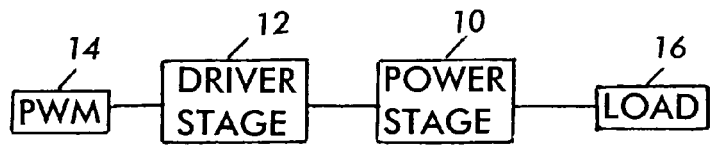
FIG. 1 illustrates a power management arrangement according to the prior art.

Referring to FIG. 1, a power management arrangement according to the prior art includes a power stage 10, a driver stage 12 operatively coupled to power stage 10 to control the operation of power stage 10, a pulse width modulation (PWM) stage 14 operatively coupled to driver stage 12 to control the operation thereof, and a load stage 16 operatively coupled to power stage 10 to receive power from the same.

In prior art arrangements, to maintain the proper supply of power to load stage 16, PWM stage 14 uses a predetermined criteria in order to operate driver stage 12. For example, a predetermined voltage level at the output of power stage 10 is used to determine whether driver stage 12 should operate power stage 10 to supply more power to load stage 16. In many designs, the predetermined value used for the operation of PWM 14 may not necessarily correspond to the instantaneous and transient requirements of load stage 16 which may surpass the predetermined value set forth for the design. For example, load stage 16 may be a processor which requires a transitory requirement for more power that may surpass the predetermined value of the design. As a result, the operation of the processor may be limited by the predetermined value that limits the operation of PWM 14.

Moreover, in conventional designs, PWM stage 14 is physically outside of load stage 16 and needs to be coupled to the same using, for example, wiring or the like. As a result, there may be parasitics (e.g., parasitic inductances) which can limit the response time to a transitory power requirement by the load as may be reflected by the variation in the predetermined values, e.g., a transitory deficit of power reflected by a sudden loss of voltage at the output of power stage 10.

Figure 2:
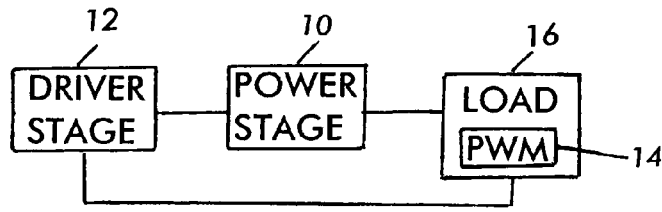
FIG. 2 illustrates a power management arrangement according to the present invention.

Referring to FIG. 2, according to one aspect of the present invention, PWM stage 14 and load stage 14 are integrated in order to reduce the parasitics, such as parasitic inductances, due to wiring or other packaging elements, whereby the speed of operation of the power management arrangement is improved.

According to another aspect of the present invention, PWM stage 14 is not only enabled to respond to predetermined values at, for example, the output of power stage 10, but is enabled to respond to transitory requests from load stage 16 for more or less power. For example, load stage 16 may instruct PWM stage 14 to discontinue sending signals to driver stage 12 despite low voltage at the output of power stage 10 to avoid overheating. Or, conversely, load stage 16 may instruct PWM stage 14 to send signals to driver stage 12 to operate despite having a voltage at the output of power stage 10 that satisfies a predetermined voltage value. For example, if load stage 16 is a processor, it may send signals to PWM stage 14 to send signals to driver stage 12 despite having a high enough voltage at the output of power stage 10 in order to ensure ample power supply for an anticipated transitory "processing job." Thus, the speed of the load may be increased.

Figure 3:
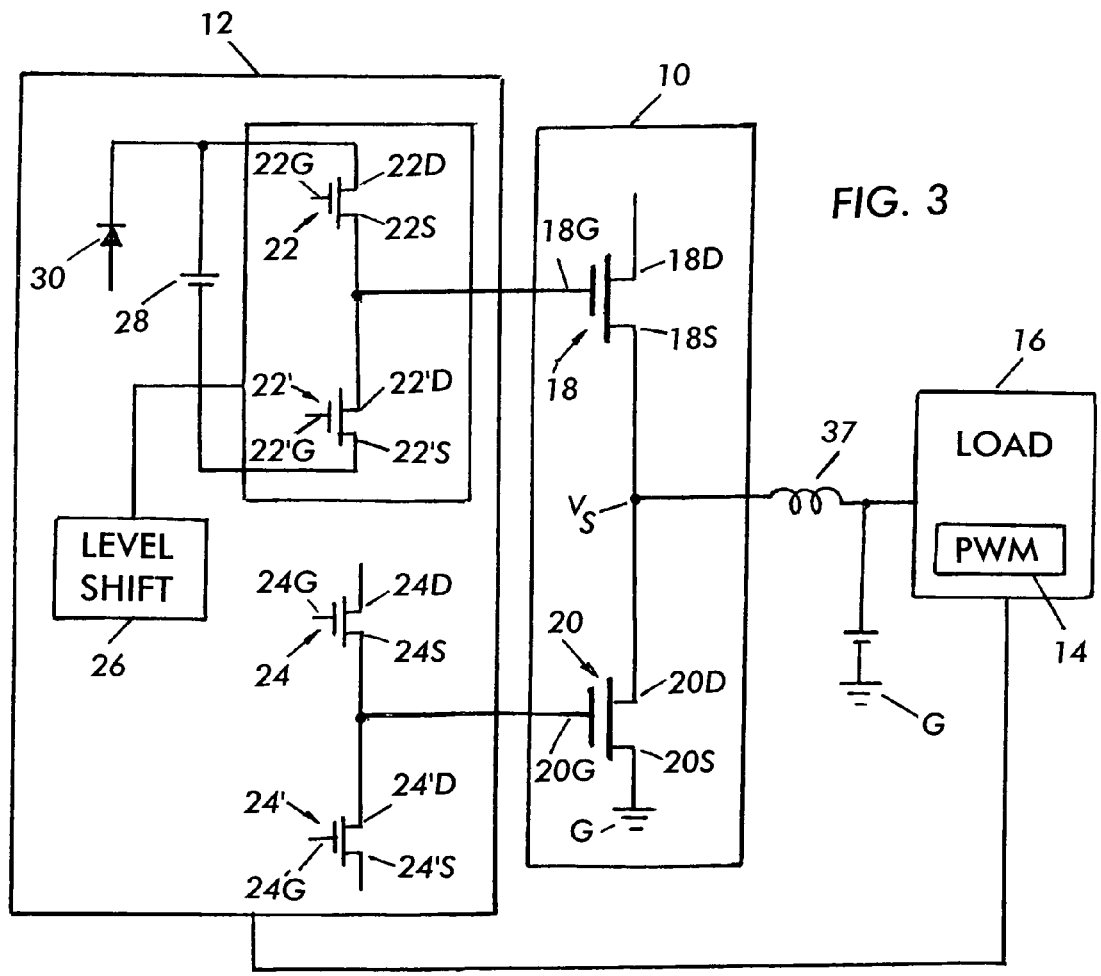
FIG. 3 illustrates a circuit diagram for a power management arrangement according to one embodiment of the present invention.

Referring now to FIG. 3, a power management arrangement according to an embodiment of the present invention includes power stage 10 that includes power switches for the control of the supply of power to load stage 16. According to one aspect of the present invention, power stage 10 includes two III-nitride switches 18, 20 coupled in a half-bridge configuration and each preferably selected to operate in a DC-DC buck converter. Thus, III-nitride switch 18, which is series connected between the high side V+ and output node $V_s$ of the half-bridge, is the control switch, while III-nitride switch 20, which is series connected between output node $V_s$ and ground G, is the synchronous switch.

Driver stage 12 includes a high side driver, which is coupled to send drive signals to the gate of switch 18, and low side driver, which is coupled to send drive signals to the gate of switch 20. High side driver includes a pair of high side driver switches 22, 22' coupled in a half-bridge configuration the output of which is coupled to send drive signals to the gate of switch 18, and low side driver includes a pair of low side driver switches 24, 24' coupled in a half-bridge configuration the output of which is coupled to send drive signals to the gate of switch 20. Note that switch 22' is the low side switch in the high side driver half-bridge while switch 24' is the low side switch in the low side driver half-bridge. The high side driver is preferably level-shifted using a level shifter 26. Thus, according to one preferred embodiment, a boot-strap capacitor 28 may be provided to provide the gate charge necessary for switch 18. As is known from conventional designs, a boot-strap diode 30 charges boot-strap capacitor 28 when switch 18 is off and $V_s$ swings to ground.

Each of the switches 18, 20, 22, 22', 24, 24' includes a drain, a source and a gate electrode. For better understanding of the Figures herein, Table I provides numeral identification for the drain, the source, and the gate of each switch.

TABLE I

| SWITCH | SOURCE | DRAIN | GATE |
| --- | --- | --- | --- |
| 18 | 18S | 18D | 18G |
| 20 | 20S | 20D | 20G |
| 22 | 22S | 22D | 22G |
| 22' | 22'S | 22'D | 22'G |
| 24 | 24S | 24D | 24G |
| 24' | 24'S | 24'D | 24'G |

Note that according to an aspect of the present invention, load stage 16 includes PWM stage 14, which is schematically shown, coupled to driver stage 12 to send control signals to the same.

According to another aspect of the present invention, high side driver switches 22 and 22', and low side driver switches 24, 24' are also III-nitride switches. While switches 18, 20, 22, 22', 24, 24' can be enhancement mode devices or depletion mode devices, in one preferred embodiment, switches 18, 20 of power stage 10 are depletion mode devices, while switches 22, 22' and 24, 24' are enhancement mode devices. Alternatively, switches 22, 22', 24, 24' may be depletion mode devices as well.

It should be noted that while the arrangement according to the present invention is illustrated with a buck converter type circuit, it is to be understood that an arrangement according to the present invention can be adapted for any desired type of buck/boost dc to dc or ac to dc converter type circuit.

It should be further noted that $V_s$ in a typical application may be coupled to an output circuit that includes an output inductor 35 series connected with $V_s$ and an output capacitor 37 that is connected between the inductor and ground as is conventionally known. Thus, in a typical application the output power is supplied to load stage 16 from the connection point between output inductor 35 and output capacitor 37.

Conventionally, the high side driver and the low side driver are discretely packaged and are separately mounted and connected to their respective power switches over long connection paths.

Figure 4:
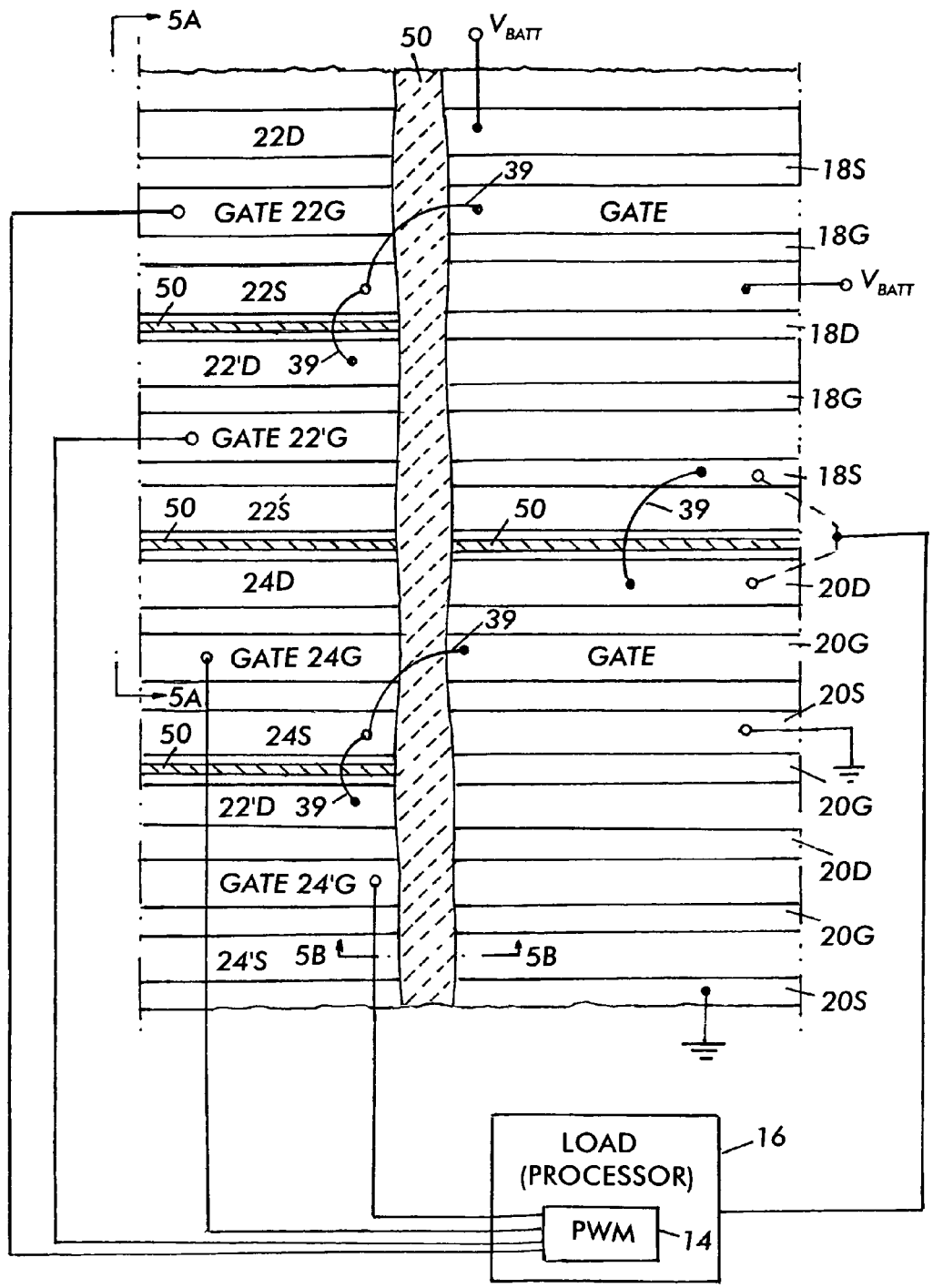
FIG. 4 illustrates schematically a top plan view of an integrated III-nitride semiconductor device that includes a power stage and a driver stage according to the present invention.
Figure 5A:
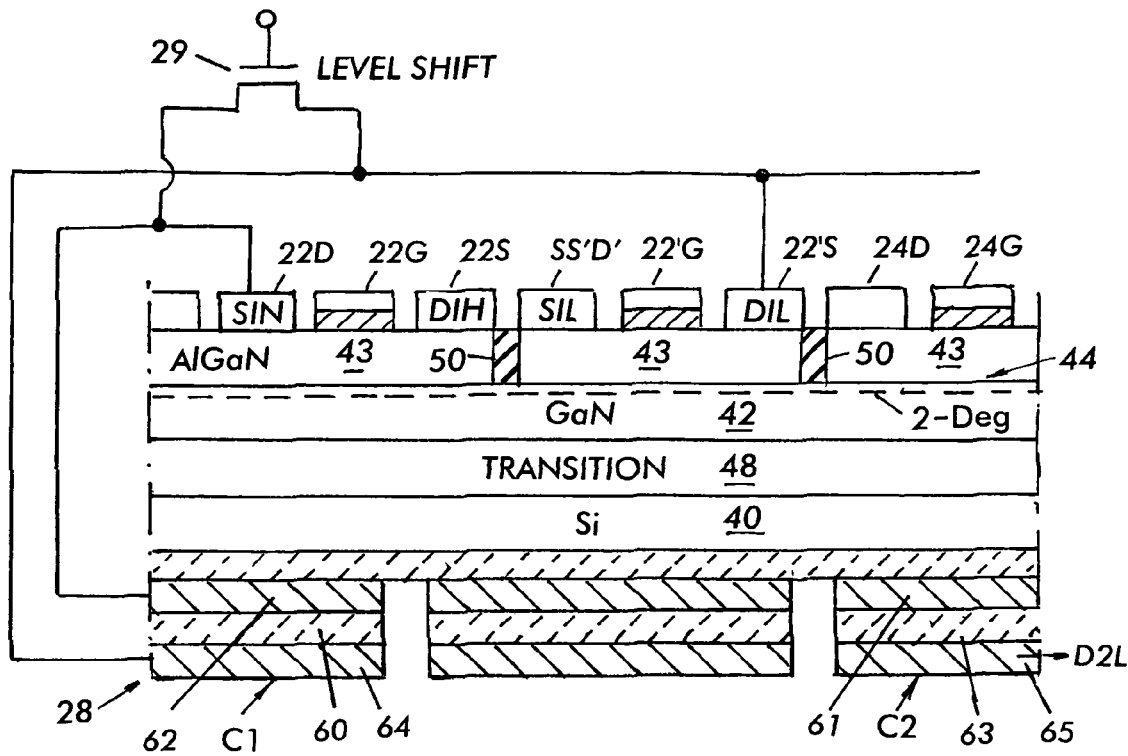
FIG. 5A is a cross-section taken across section line 5A-5A in FIG. 4 viewed in the direction of the arrows.
Figure 5B:
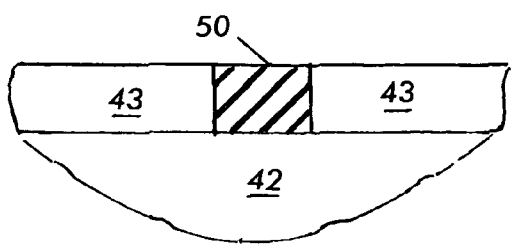
FIG. 5B is a cross-sectional view taken along line 5B-5B in FIG. 4 viewed in the direction of the arrows.

In accordance with the present invention, the high and low side drivers and the power switches 18 and 20 are integrated into a common monolithic semiconductor die. If desired, level shift circuit 26 and passives such as bootstrap capacitor 28 and bootstrap diode 30 may also be integrated into the common die. FIGS. 4, 5A, and 5B show one embodiment of a monolithic semiconductor die according to the present invention.

In FIGS. 4 and 5A, the same numerals identify the same circuit components of FIG. 3. The basic chip includes, as shown in FIG. 4, of a substrate 40 which is preferably silicon. A conventional transition layer 41 (e.g., AlN) is disposed on silicon substrate 40 and receives thereon a gallium nitride (GaN) layer 42. An AlGaN layer 43 is formed atop layer 42, to define a heterojunction having a carrier rich region conventionally referred to as two-dimensional electron gas (2-DEG) 44. The die may be constructed by other techniques with other layers, to define another type of III-nitride device.

In accordance with one aspect of the present invention, and as best shown in FIG. 4 and FIG. 5B, an insulation or other barrier 50 is formed in the die and extends to at least the depth of GaN layer 42 to define a control device "well" to the left of (or on one side of) barrier 50 and a power device surface to the right of barrier 50. Specifically, a trench may be formed in AlGaN layer 43 and filled with a dielectric to electrically isolate the control device well by interrupting the 2-DEG. Preferably, the trench may extend all the way to GaN layer 42. A plurality of spaced parallel electrodes are formed across the surface of the chip as shown in FIG. 4 and may be interrupted by the barrier 50. Further, note that, switches 18, 20, and switches 22, 22', 24, 24' may be isolated from one another using the same concept. Specifically, a trench that preferably extends through AlGaN layer 43 and is filled with a dielectric 50 may be provided between the switches as illustrated in order to interrupt the 2-DEG and thus render the switches electrically isolated.

Short wire bonds 39 are then employed (as illustrated by FIG. 4) to form the desired circuit of FIG. 3. Alternatively, conductive vias and bump contacts for flip chip mounting can be employed.

It is also possible to integrate bootstrap capacitor 28 in the common die as best shown in FIG. 5A. Thus, conductive layers 60, 61 (on the bottom of the Si substrate); dielectric layers 62, 63 and bottom conductive layers 64, 65 are employed such that layers 60, 62, 64 define bootstrap capacitor 28.

Bootstrap capacitor 28 can also be integrated on the top of the common die of FIG. 4 or on the outer package of the device.

The various interconnections in FIGS. 4 and 5A may be formed, at least partially by vias through the body of the common die.

The structure of FIGS. 4 and 5A defines a power block according to the present invention that includes a driver stage and a power stage. A microprocessor 70, serving, for example, as the load stage 16, is connected to suitably control a PWM stage or the like to operate the gates of driver switches 22, 22', 24, 24'. Power block may be mounted on the processor chip/module as close as possible to the chip or alongside the chip. In this manner, the advantages described above are realized.

One advantage of a monolithically formed power III-nitride switches 18, 20, and driver switches 22, 22', 24, 24' is the ease of the fabrication thereof. Specifically, because heterojunction III-nitride power semiconductor devices take advantage of conduction through a 2-DEG, a single III-nitride heterojunction may be used as the basis for the active region of all switches 18, 20, 22, 22', 24, 24'. The isolation of the switches can also be relatively simple. Moreover, the power capability, switching speed, and breakdown rating of each switch can be simply designed by using the relationship between the drain, the source, and the gate electrodes of the device. Thus, for example, switches requiring more current conduction capability can have more active cells (e.g. synchronous switch 20), while switches requiring less current carrying capability (e.g. driver switches 22, 22', 24, 24') can have fewer active cells. Since the number of active cells is relatively easy to design in, integration of III-nitride switches to obtain a monolithic device according to the present invention is advantageously uncomplicated.

Figure 6:
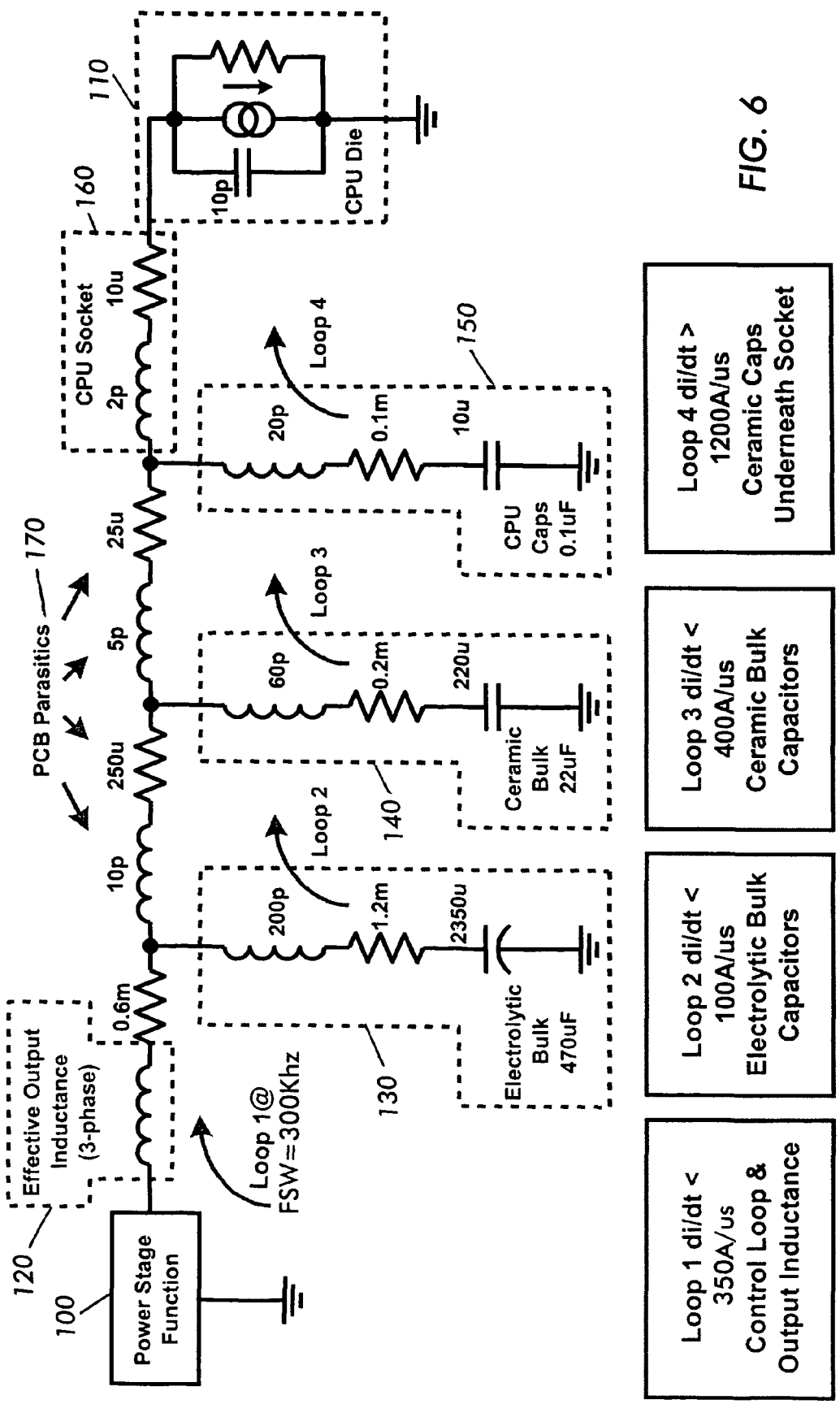
FIG. 6 illustrates a conventional arrangement involving a power stage and a processor.

Referring now to FIG. 6, in a prior art power arrangement the path between power stage 100 and load 110, which can be, for example, a processor such as a CPU of a personal computer, includes a plurality of loops that introduce parasitics which reduce the speed of the arrangement as well as its efficiency. The arrangement may include loops 130, 140, 150, each including a parasitic resistance and a parasitic inductance. the arrangement may further include PCB parasitics 170 due to packaging; e.g. wirebonding, circuit board traces, solder or the like. Thus, for example, at a switching frequency of about 300 Khz, the output inductance loop 120, which may be an output inductor, can reduce the di/dt to less than 350 A/µs, output capacitor loop 130, which may be an electrolytic capacitor, can reduce the di/dt to less than 100 A/µs, ceramic bulk capacitors loop 140 can reduce di/dt to less than 400 A/µs, and ceramic caps loop 150 underneath the socket can reduce the di/dt to 1200 A/µs. The arrangement may further include a parasitic loop 160 due to the connectors of the load (e.g. CPU sockets or the like) which may further introduce parasitics into the arrangement.

Figure 7A:
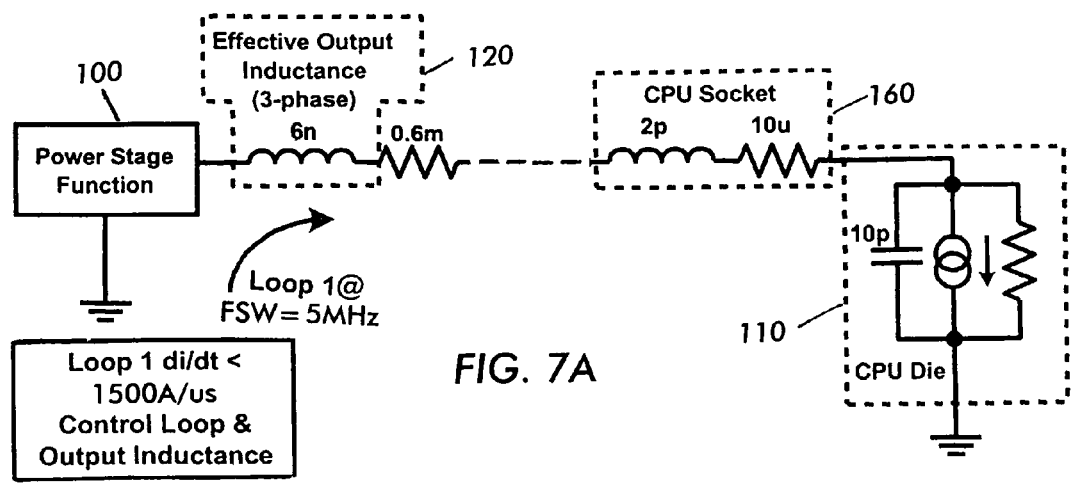
FIGS. 7A-7C illustrate an arrangement according to the present invention resulting in reduced parasitics, e.g. parasitic inductances.
Figure 7B:
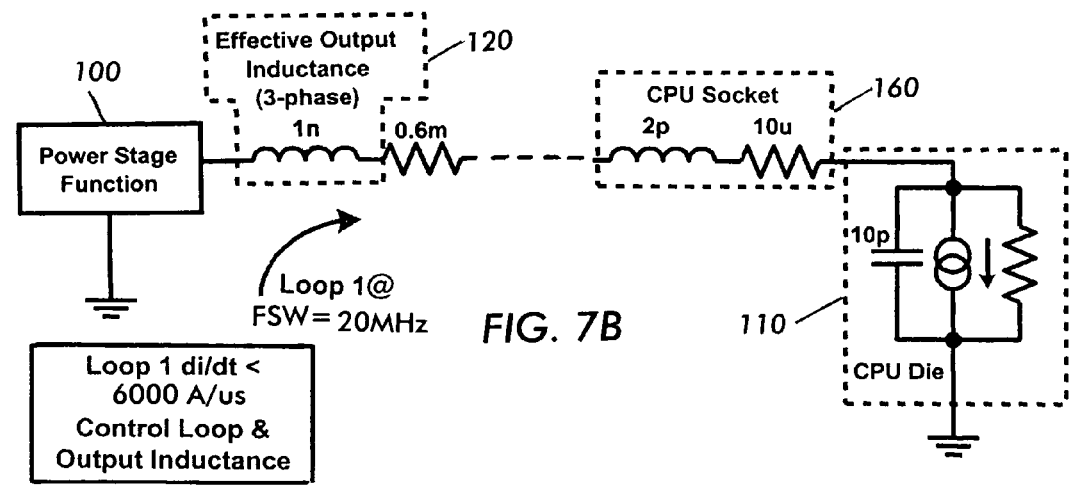
Figure 7C:
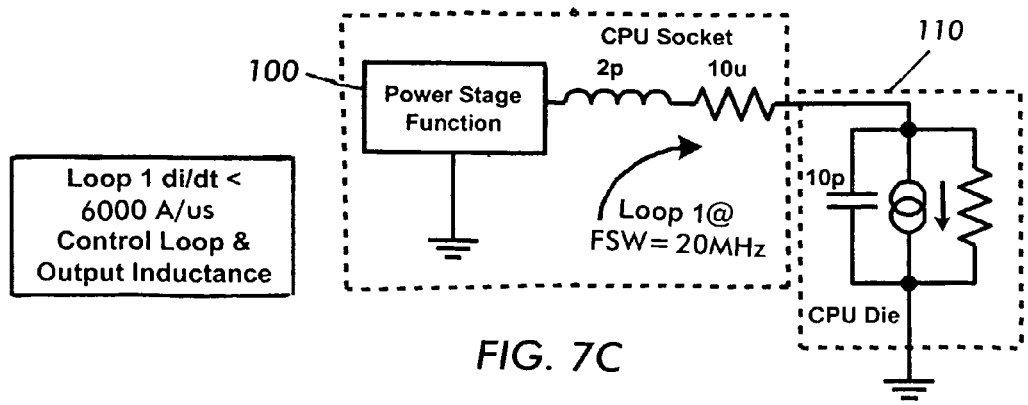

Referring now to FIGS. 7A-7C, a power stage according to the present invention can increase the switching speed to about 75 Mhz (FIG. 7A), which can in turn reduce the inductance of output inductance loop 120, whereby di/dt can be increased to about 1500 A/µs, or the switching speed can be increased to about 20 Mhz (FIG. 7B) to reduce the inductance of output inductance loop, thereby increasing di/dt to 6000 A/µs. Referring specifically to FIG. 7C, further reduction in parasitics can be achieved by disposing power stage 100 as close as possible to load 110 to shorten the path therebetween. For example, power stage 100 can be integrated with load 110 in order to reduce the parasitics and increase the switching speed with consequent reduction in the size of passives and increase in efficiency.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power management arrangement comprising:
a power stage that includes III-nitride power switches;
a driver stage that controls the operation of the power stage;
a load stage coupled to said power stage to receive power for the operation thereof, the load stage including a driver stage control circuitry to generate signals for the control of the operation of the driver stage.

2. The arrangement of claim 1, wherein said III-nitride power switches arc coupled in a half-bridge arrangement.

3. The arrangement of claim 1, wherein said III-nitride power switches are depletion mode devices.

4. The arrangement of claim 1, wherein said driver stage includes a first pair of III-nitride switches arranged in a half-bridge for driving a first one of said III-nitride power switches and a second pair of III-nitride switches arranged in a half-bridge for driving a second one of said III-nitride power switches.

5. The arrangement of claim 4, wherein said first pair of III-nitride switches and said second pair of switches are enhancement mode switches.

6. The arrangement of claim 4, wherein said first pair of III-nitride switches and said second pair of III-nitride switches are depletion mode switches.

7. The arrangement of claim 5, wherein said driver stage control circuitry generates pulse width modulation signals.

8. The arrangement of claim 6, wherein said driver stage control circuitry generates pulse width modulation signals.

9. The arrangement of claim 1, wherein said driver stage control circuitry generates pulse width modulation signals.

10. The arrangement of claim 1, wherein said power stage and said driver stage are formed in a common die.

11. The arrangement of claim 1, wherein said signals are generated when an output voltage of said power stage falls outside of a pre-set range.

12. The arrangement of claim 1, wherein said signals are generated due to a load-specific condition.

13. The arrangement of claim 12, wherein said load-specific condition includes the instantaneous temperature of said load.

14. The arrangement of claim 12, wherein said load-specific condition includes the speed of said load.

15. The arrangement of claim 1, wherein said load stage includes a microprocessor.

16. The arrangement of claim 1, wherein said load stage includes a memory device.

17. A power management arrangement comprising:
a monolithic semiconductor die having formed therein a first III-nitride power semiconductor device and a second III-nitride power semiconductor device coupled to said first III-nitride power semiconductor device in a half-bridge configuration that includes an output node, a first driver half-bridge arrangement that is operatively coupled to said first III-nitride power semiconductor device, and a second driver half-bridge arrangement that is operatively coupled to said second III-nitride power semiconductor device.

18. The arrangement of claim 17, wherein said first and second driver half-bridge arrangements each includes a pair of enhancement mode III-nitride switches.

19. The arrangement of claim 17, wherein said first and second driver half-bridge arrangements each includes a pair of depletion mode III-nitride switches.

20. The arrangement of claim 17, wherein said first driver half-bridge is coupled to a level shift circuit that includes a level shift capacitor, wherein said capacitor is formed on a surface of said monolithic semiconductor die.

21. The arrangement of claim 17, wherein said output node is coupled to a load stage that includes driver control circuitry that generates signals for the operation of said first and second driver half-bridge arrangements.

22. The arrangement of claim 21, wherein said driver stage control circuitry generates pulse width modulation signals.

23. The arrangement of claim 21, wherein said signals are generated when an output voltage of said power stage falls outside of a pre-set range.

24. The arrangement of claim 21, wherein said signals are generated due to a load-specific condition.

25. The arrangement of claim 24, wherein said load-specific condition includes the instantaneous temperature of said load.

26. The arrangement of claim 24, wherein said load-specific condition includes the speed of said load.

27. The arrangement of claim 17, further comprising a load stage, wherein said load stage and said monolithic semiconductor die are integrated.

28. The arrangement of claim 27, wherein said load stage includes a microprocessor.

29. The arrangement of claim 27, wherein said load stage includes a memory device.

* * * * *

UNITED STATES PATENT AND TRADEMARK OFFICE
CERTIFICATE OF CORRECTION

PATENT NO. : 7,863,877 B2  Page 1 of 1
APPLICATION NO. : 11/999552
DATED : January 4, 2011
INVENTOR(S) : Michael A. Briere It is certified that error appears in the above-identified patent and that said Letters Patent is hereby corrected as shown below:

In the claims, column 7, line 50, "arc" should be changed to --are--.

In the claims, column 7, line 60, --III-nitride-- should be inserted immediately after "second pair of".

Signed and Sealed this
Twenty-second Day of November, 2011

David J. Kappos
*Director of the United States Patent and Trademark Office*